(12) United States Patent
Zhao et al.

(10) Patent No.: US 11,170,833 B2
(45) Date of Patent: Nov. 9, 2021

(54) HIGHLY RELIABLE STT-MRAM STRUCTURE AND IMPLEMENTATION METHOD THEREOF

(71) Applicant: BEIHANG UNIVERSITY, Beijing (CN)

(72) Inventors: Weisheng Zhao, Beijing (CN); Kaihua Cao, Beijing (CN); Erya Deng, Beijing (CN); Wenlong Cai, Beijing (CN); Shaohua Yan, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 0 days.

(21) Appl. No.: 16/928,716

(22) Filed: Jul. 14, 2020

(65) Prior Publication Data

US 2020/0342927 A1 Oct. 29, 2020

(30) Foreign Application Priority Data

Sep. 10, 2019 (CN) .......................... 201910850941.7

(51) Int. Cl.
*G11C 11/16* (2006.01)
(52) U.S. Cl.
CPC ........ *G11C 11/161* (2013.01); *G11C 11/1673* (2013.01); *G11C 11/1675* (2013.01)
(58) Field of Classification Search
CPC .............. G11C 11/161; G11C 11/1673; G11C 11/1675
USPC .......................................................... 365/158
See application file for complete search history.

(56) References Cited

U.S. PATENT DOCUMENTS

| 9,842,638 | B1* | 12/2017 | Li | ............... | G11C 29/50 |
| 2003/0103402 | A1* | 6/2003 | Tran | ............ | G11C 11/16 365/211 |
| 2010/0091562 | A1* | 4/2010 | Chen | ............ | G11C 11/1659 365/171 |
| 2013/0322162 | A1* | 12/2013 | Lee | ............ | G11C 11/1675 365/158 |
| 2015/0049536 | A1* | 2/2015 | Oh | ............ | G11C 11/1675 365/148 |
| 2016/0099052 | A1* | 4/2016 | Lee | ............ | G11C 11/1659 365/148 |
| 2020/0159441 | A1* | 5/2020 | Mayer | ............ | G06F 3/0604 |
| 2020/0185011 | A1* | 6/2020 | Park | ............ | G11C 7/12 |
| 2020/0194047 | A1* | 6/2020 | Chen | ............ | G11C 11/1693 |

* cited by examiner

*Primary Examiner* — Sung Il Cho (57) ABSTRACT

A highly reliable STT-MRAM structure and an implementation method thereof are provided. The STT-MRAM structure includes: a memory block array, including a plurality of memory blocks; on-chip in-situ temperature sensors, for detecting an instantaneous temperature of each memory block; and a controller, which outputs a reading or writing operation signal based on the instantaneous temperature of each memory block detected by the on-chip in-situ temperature sensors, so as to modulate respective voltages and/or frequencies of reading and writing operations of each memory block. When the instantaneous temperature is too high, the voltages and/or frequencies of the reading and writing operations would be decreased, to the contrary when the instantaneous temperature is too low, the voltages and/or frequencies of the reading and writing operations would be increased, which expands a reliable working temperature range and lengthens a lifetime of the STT-MRAM structure.

9 Claims, 5 Drawing Sheets

HIGHLY RELIABLE STT-MRAM STRUCTURE AND IMPLEMENTATION METHOD THEREOF

CROSS REFERENCE OF RELATED APPLICATION

The application claims priority under 35 U.S.C. 119(a-d) to CN 201910850941.7, filed Sep. 10, 2019.

BACKGROUND OF THE PRESENT INVENTION

Field of Invention

The present invention relates to a technical field of spintronics memory, and more particularly to a highly reliable STT-MRAM (Spin transfer torque-magnetic random access memory) structure and an implementation method thereof.

Description of Related Arts

The conventional STT-MRAM (Spin transfer torque-magnetic random access memory) structures have many deficiencies, such as problems of relatively high error rates of reading and writing operations, and easily being influenced by a working temperature.

SUMMARY OF THE PRESENT INVENTION

In order to solve at least one of the above deficiencies, the present invention provides a highly reliable STT-MRAM (Spin transfer torque-magnetic random access memory) structure, comprising:

a memory block array, comprising a plurality of memory blocks;

temperature sensors, for detecting instantaneous temperatures of each of the memory blocks in the memory block array; and a controller, which outputs a reading or writing operation signal based on the instantaneous temperature of each memory block detected by the temperature sensors, so as to modulate respective voltages and/or frequencies of reading and writing operations of each memory block.

Preferably, the controller comprises a plurality of external voltage drives, which could change reading and/or writing operation voltages of each memory block according to the instantaneous temperature detected by the temperature sensors.

Preferably, the controller comprises a plurality of external frequency drives, which could change reading and/or writing operation frequencies of each memory block according to the instantaneous temperature detected by the temperature sensors.

Preferably, based on a preset first relationship, according to the instantaneous temperature of each memory block, the controller modulates the writing operation voltage $V_{dd\_w}$; the preset first relationship is an inverse proportional function of temperature T, and a formula thereof is:

$V_{dd\_w}=V_{w0}-k_1T$, wherein: $k_1$ is a positive coefficient, and $V_{w0}$ is a constant based on a magnetization switching voltage at zero absolute temperature.

Preferably, each temperature sensor comprises:

a thin ferrimagnetic layer film, comprising a limited area, wherein ferrimagnetic skyrmions are formed in the limited area;

a current transmission layer, for transmitting a spin-polarized current to the limited area of the thin ferrimagnetic layer film;

a plurality of first insulation pillars, which are arranged on a surface of the thin ferrimagnetic layer film and far away from the current transmission layer, and located at set positions of the limited area; and a plurality of first magnetic layers, which respectively correspond to the first insulation pillars and are arranged on a surface of each first insulation pillar and far away from the thin ferrimagnetic layer film;

wherein: each first insulation pillar has a first thickness able to make up a first MTJ (Magnetic tunnel junction) together with the thin ferrimagnetic layer film and a corresponding first magnetic layer;

an external current detecting component applies a given voltage to each first magnetic layer and collects a current under the given voltage, so as to monitor a temperature value according to a varied current flowing through each first magnetic layer with a set position of a corresponding first insulation pillar;

each temperature sensor further comprises a second insulation pillar, which is arranged on the surface of the thin ferrimagnetic layer film and far away from the current transmission layer, and located at an arbitrary position of the limited area;

each temperature sensor further comprises a second magnetic layer, which is arranged on a surface of the second insulation pillar and far away from the thin ferrimagnetic layer film; and the second insulation pillar has a second thickness able to make up a second MTJ together with the thin ferrimagnetic layer film and the second magnetic layer.

Preferably, based on a preset second relationship, according to the instantaneous temperature of each memory block, the controller modulates the reading operation voltage $V_{dd\_r}$; the preset second relationship is a proportional function of temperature T, and a formula thereof is:

$V_{dd\_r}=V_{r0}+k_2T$, wherein: $k_2$ is a positive coefficient, and $V_{r0}$ is a constant based on the reading operation voltage at zero absolute temperature.

Preferably, based on a preset third relationship, according to the instantaneous temperature of each memory block, the controller modulates the writing operation frequency $f_{write}$; the preset third relationship is a proportional function of temperature T, and a formula thereof is:

$f_{write}=f_0+k_3T$, wherein: $k_3$ is a positive coefficient, and $f_0$ is a constant based on the writing operation frequency at zero absolute temperature.

Preferably, each memory block comprises at least one MTJ.

The present invention further provides a highly reliable STT-MRAM structure, comprising:

a memory block array, comprising a plurality of memory blocks;

temperature sensors, for detecting instantaneous temperatures of at least part of the memory blocks in the memory block array; and a controller, which generates an average temperature according to temperature values monitored by the temperature sensors and outputs a reading or writing operation signal based on the average temperature, so as to modulate voltages and/or frequencies of reading and writing operations of the memory block array.

The present invention further provides an implementation method of the highly reliable STT-MRAM structure, comprising steps of:

detecting an instantaneous temperature of each memory block;

based on the instantaneous temperature of each memory block, outputting a reading or writing operation signal; and receiving the reading or writing operation signal, and modulating respective voltages and/or frequencies of reading and writing operations of each memory block.

The highly reliable STT-MRAM structure and implementation method provided by the present invention can expand to Spintronics memory like: Field-like MRAM, Toggle MRAM, SOT-MRAM, STT+SOT-MRAM, VCMA-MRAM, etc, The present invention has beneficial effects as follows.

The highly reliable STT-MRAM structure and the implementation method thereof are provided by the present invention. Through the on-chip in-situ temperature sensors, the instantaneous temperature of each memory block is detected, or the total instantaneous temperature of the whole memory block array is detected; then the temperature signal is transmitted to the controller; based on the received temperature signal, the controller outputs the reading or writing operation signal, so as to modulate the voltages and/or frequencies of the reading and writing operations; when the instantaneous temperature is too high, the voltages and/or frequencies of the reading and writing operations would be decreased, to the contrary when the instantaneous temperature is too low, the voltages and/or frequencies of the reading and writing operations would be increased, so as to maintain a suitable working temperature of the memory block array, and further to solve the problems of the write failure in the low-temperature zone and the read error in the high-temperature zone of the STT-MRAM structure, which expands the reliable working range of the STT-MRAM structure and lengthens the lifetime of the STT-MRAM structure.

BRIEF DESCRIPTION OF THE DRAWINGS

In order to illustrate the technical solutions in the embodiments of the present invention or the prior art more clearly, the accompanying drawings for describing the embodiments or the prior art are simply described below. Apparently, the accompanying drawings in the following description are merely some embodiments of the present invention, and persons of ordinary skill in the art can derive other drawings from the accompanying drawings without creative efforts.

DETAILED DESCRIPTION OF THE PREFERRED EMBODIMENT

The technical solutions in the preferred embodiment of the present invention will be clearly and completely described with the accompanying drawings. Apparently, the described embodiments are merely a part of the embodiments of the present invention, not all the embodiments. Based on the embodiments of the present invention, one of ordinary skill in the art can acquire other embodiments without the creative efforts, which should be all encompassed in the protection scope of the present invention.

Figure 1:
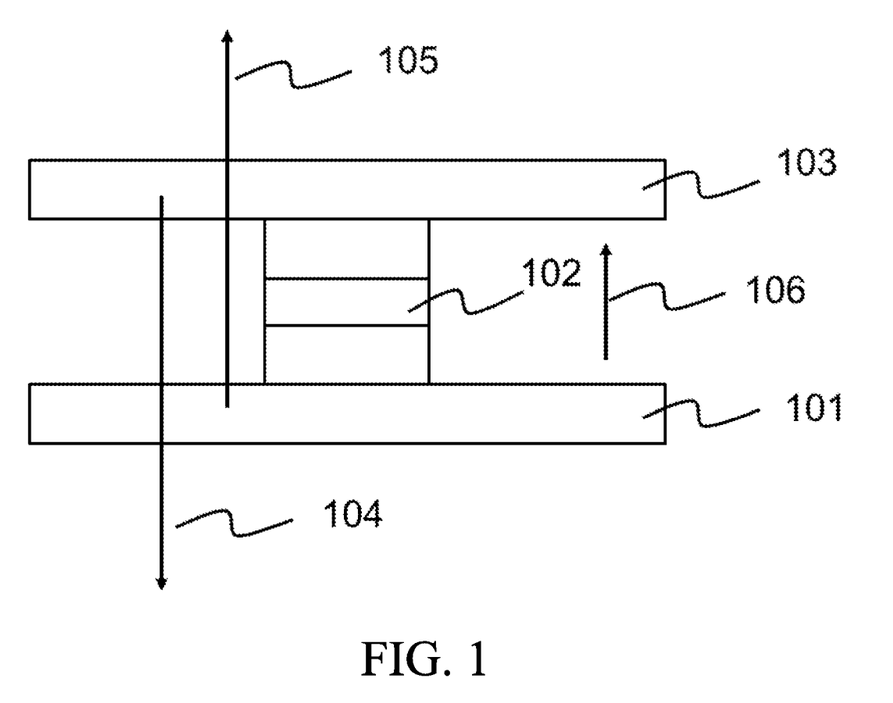
FIG. 1 is a principle diagram of writing and reading operations of a conventional STT-MRAM (Spin transfer torque-magnetic random access memory) structure in prior art.
Figure 2:
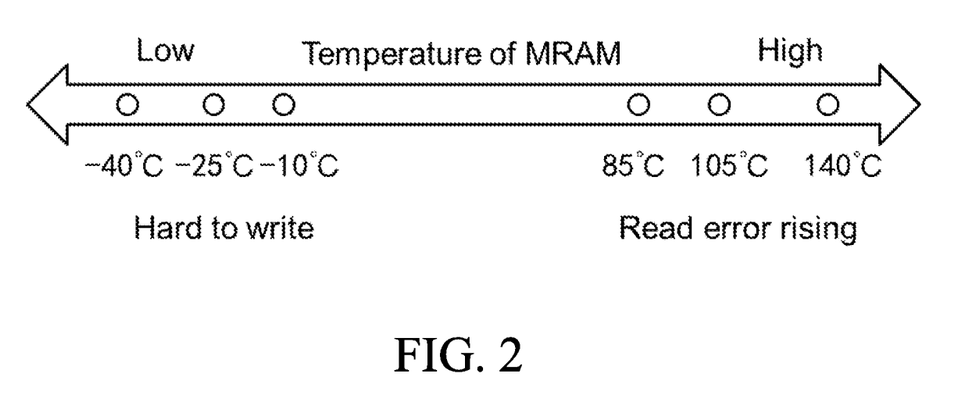
FIG. 2 is a sketch view of write and read characteristics of the conventional STT-MRAM structure under different working temperatures.
Figure 3:
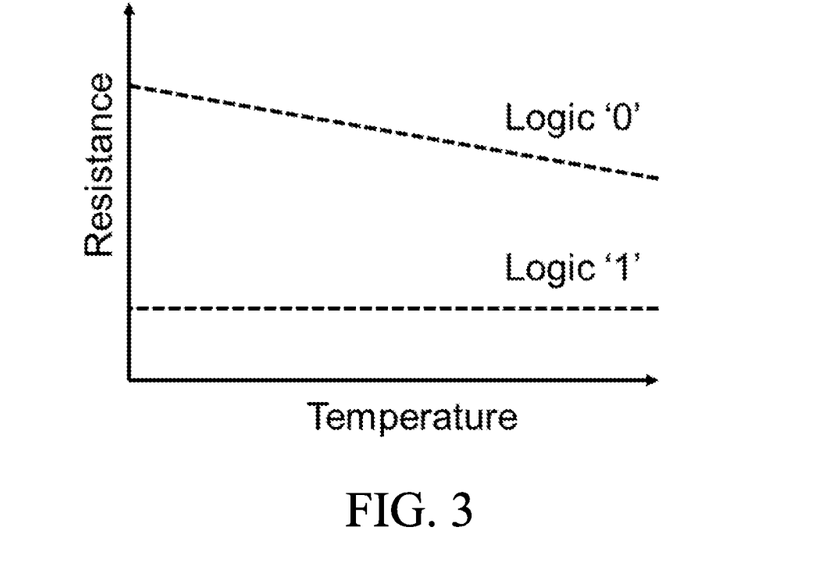
FIG. 3 shows a change of a resistance state of a memory device of the STT-MRAM structure with an absolute temperature.
Figure 4:
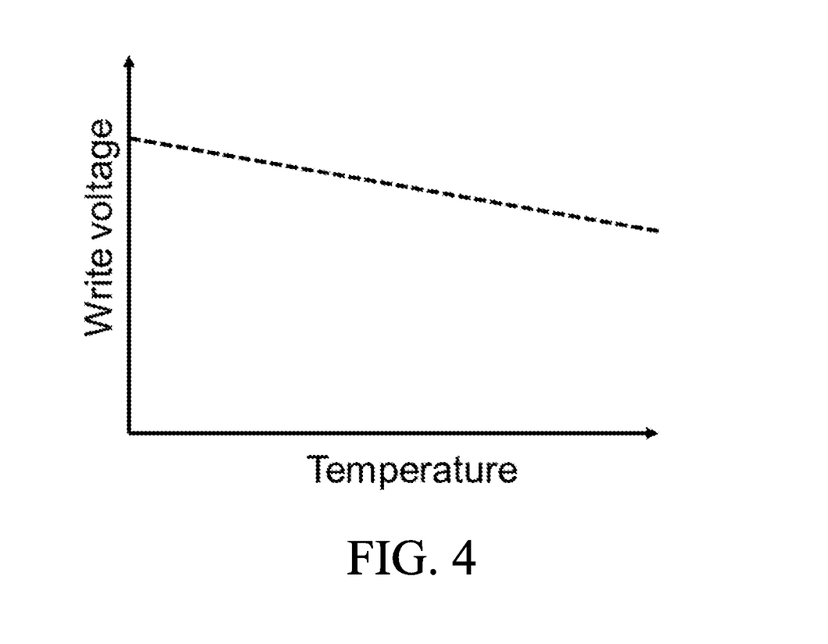
FIG. 4 shows a change of a write voltage of the STT-MRAM structure with the varied absolute temperature.

MTJ (Magnetic tunnel junction) 102 is a core memory device of a STT-MRAM (Spin transfer torque-magnetic random access memory) structure. As shown in FIG. 1, writing operation currents of the STT-MRAM structure are two currents 104 and 105 respectively passing through the MTJ 102 through a bottom electrode 101 and a top electrode 103 in opposite directions, and a reading operation current 106 of the STT-MRAM structure is generally a relatively small current passing through the MTJ 102. As shown in FIGS. 2-4, because a write current (voltage) of the STT-MRAM structure is inversely proportional to a temperature (absolute temperature), the lower working temperature requires the larger write current (voltage). Therefore, in a low-temperature zone, the writing operation of MRAM becomes difficult, and a problem of write failure easily occurs; in comparison, in a high-temperature zone, the writing operation becomes simple, but a read error becomes worse due to a read margin becoming smaller. Thus, the conventional STT-MRAM structures have problems of relatively high error rates of reading and writing operations, easily being influenced by a working temperature, etc.

Figure 6:
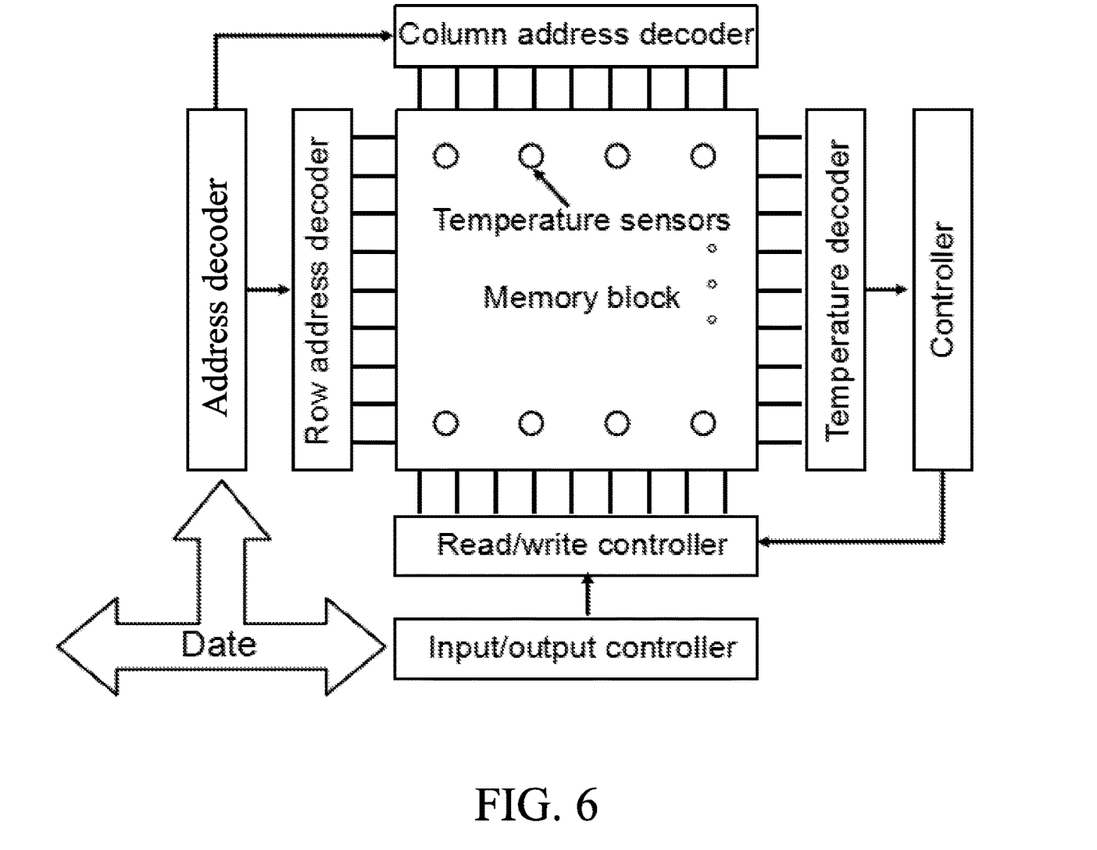
FIG. 6 is a structural sketch view of a highly reliable STT-MRAM structure according to a preferred embodiment of the present invention.

In view of the above, according to the preferred embodiment of the present invention, a highly reliable STT-MRAM structure is provided. FIG. 6 shows an example of the highly reliable STT-MRAM structure, comprising: a memory block array, comprising a plurality of memory blocks (not shown in FIG. 6); temperature sensors, for detecting the instantaneous temperature of each memory block; and a controller, which outputs a reading or writing operation signal based on the instantaneous temperature of each memory block detected by the temperature sensors, so as to modulate respective voltages and/or frequencies of reading and writing operations of each memory block.

According to the highly reliable STT-MRAM structure provided by the preferred embodiment of the present invention, the instantaneous temperature of each of the memory blocks is/are detected through the temperature sensors and then the temperature signal is transmitted to the controller; thereafter, based on the received temperature signal of each memory block, the controller outputs the reading or writing operation signal, so as to modulate the voltages and/or frequencies of the reading and writing operations; when the instantaneous temperature is too high, the voltages and/or frequencies of the reading and writing operations would be decreased, to the contrary when the instantaneous temperature is too low, the voltages and/or frequencies of the reading and writing operations would be increased, so as to maintain a suitable working temperature of the memory block array, and further to solve the problems of the write failure in the low-temperature zone and the read error in the high-temperature zone of the STT-MRAM structure, which expands a reliable working range of the STT-MRAM structure and lengthens a lifetime of the STT-MRAM structure.

In the highly reliable STT-MRAM structure provided by the preferred embodiment of the present invention, each memory block is independent from each other, and the controller modulates the respective reading and writing operations of each memory block independently, so that the temperature of each memory block is in a relatively suitable temperature range and each memory block is respectively controlled.

It can be understood that: the highly reliable STT-MRAM structure in the preferred embodiment of the present invention can expand to Toggle-MRAM, SOT-MRAM, STT+SOT-MRAM, VCMA-MRAM, etc, and the present invention is not limited thereto. Obviously, each memory block of the STT-MRAM structure comprises at least one MTJ, and the memory block in the present invention is defined as a smallest block in the STT-MRAM structure.

The STT-MRAM structure is a memory whose information is written through the spin transfer torque (STT) and could induce magnetization reversal assisted with the spin-hall effect; in this manner, the final magnetization reversal is still completed by the conventional STT, but assisted with the spin-hall effect; therefore, the process requires two write currents respectively flowing through the MTJ and the heavy metal film, for generating the STT and the spin-hall effect. When the current flowing through the heavy metal is lower than a certain threshold, writing of the spin electronic storage information is reversed through magnetization, and the magnetization reversal process is still dominated by the STT with the spin-hall effect (or the spin orbital torque) only playing the secondary role. When the current is higher than the threshold, the magnetization reversal process is completely different from the conventional STT way that the magnetization vector crosses over the in-plane direction in a very short time, indicating that the spin orbital torque eliminates the initial delay and dominates the magnetization reversal process. However, in this case, the magnetization vector is not completely reversed, indicating that the spin orbital torque has the negative effects in the later period of writing, and thus it needs to be removed at the right time. The final formed writing way is that: a current larger than the threshold is applied along the heavy metal; at the moment of about 0.5 ns, the current is removed; and the subsequent magnetization reversal process is completed by the STT. The above writing way eliminates the initial delay and improves the writing speed.

Figure 5:
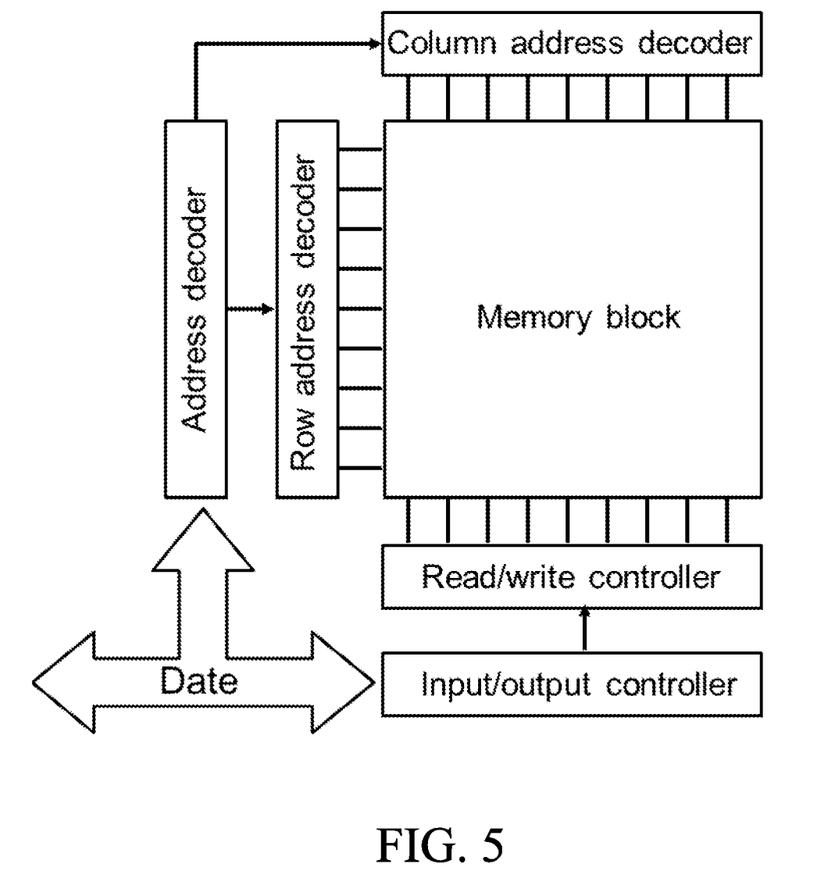
FIG. 5 is a structural sketch view of the conventional STT-MRAM structure in prior art.

FIG. 5 is a structural sketch view of the conventional STT-MRAM structure in prior art, comprising a memory block array, address decoders and input and output controllers. The reading operation of the data comprises inputting the address data and the read instruction; the row address decoder and the column address decoder select the MTJ in the memory block array; the read controller applies the read voltages at the two terminals of the MTJ; and the detecting circuit converts the detecting current into the read data. The writing operation of the data comprises inputting the address data, the data to be written and the write instruction; the row address decoder and the column address decoder select the MTJ in the memory block array; according to the data to be written, the write controller applies the write voltages at the two terminals of the MTJ; and the data to be written is written into the specified MTJ.

With an example of the highly reliable STT-MRAM structure, the inventive concept of the present invention is illustrated as follows.

The temperature sensors can detect the instantaneous temperature of each memory block and then transmit to the controller; after receiving the temperature signal of each memory block, the controller outputs the corresponding operation signal according to the preset relationships.

In one embodiment, the controller comprises a plurality of external voltage drives, which could change the reading and/or writing operation voltages of each memory block according to the instantaneous temperature detected by the temperature sensors.

In the highly reliable STT-MRAM structure, the relationship between the writing operation voltage and the temperature (absolute temperature) is a preset first relationship; the preset first relationship is an inverse proportional function of temperature T, and a formula thereof is:

$V_{dd\_w}=V_{w0}-k_1 T$, wherein: $k_1$ is a positive coefficient, and $V_{w0}$ is a constant based on a magnetization switching voltage at zero absolute temperature.

The relationship between the reading operation voltage and the temperature (absolute temperature) is a preset second relationship; the preset second relationship is a proportional function of temperature T, and a formula thereof is:

$V_{dd\_r}=V_{r0}+k_2 T$, wherein: $k_2$ is a positive coefficient, and $V_{r0}$ is a constant based on the reading operation voltage at zero absolute temperature.

It can be seen that: because of the write current characteristics of the STT-MRAM structure, the lower temperature requires the larger write current; therefore, when the instantaneous temperature of the memory block is relatively low, the writing operation voltage is increased to avoid the problem of write failure; when the instantaneous temperature of the memory block is relatively high, because the memory block itself does not require the relatively large write current, the writing operation voltage is decreased to slow down the increase of the temperature of the STT-MRAM structure, so as to avoid the increase of the error rate of the reading and writing operations.

In one embodiment, the controller comprises a plurality of external frequency drives, which could change the reading and/or writing operation frequencies of each memory block according to the instantaneous temperature detected by the temperature sensors.

The relationship between the writing operation frequency and the temperature (absolute temperature) is a preset third relationship; the preset third relationship is a proportional function of temperature T, and a formula thereof is:

$f_{write}=f_0+k_3 T$, wherein: $k_3$ is a positive coefficient, and $f_0$ is a constant based on the writing operation frequency at zero absolute temperature.

It can be seen that: the increase of the temperature requires the faster writing operation frequency; therefore, when the temperature of the memory block is relatively low, the slower writing operation frequency is provided, so that the self-heating effect of the memory block becomes stronger and the temperature of the memory block array increases, thereby reaching the relatively good temperature range; when the temperature of the memory block is relatively high, the faster writing operation frequency is provided, so that the self-heating effect of the memory block becomes weaker and the temperature of the memory block array decreases.

In some embodiments, the supply voltage and the writing operation frequency can be operated independently or modulated cooperatively. For example, in the low-temperature zone, because of the higher supply voltage and the slower writing operation frequency, the self-heating effect of the memory block becomes stronger and the temperature of the memory block array increases; in the high-temperature zone, because of the lower supply voltage and the faster writing operation frequency, the self-heating effect of the memory block becomes weaker and the temperature of the memory block array decreases.

Figure 8:
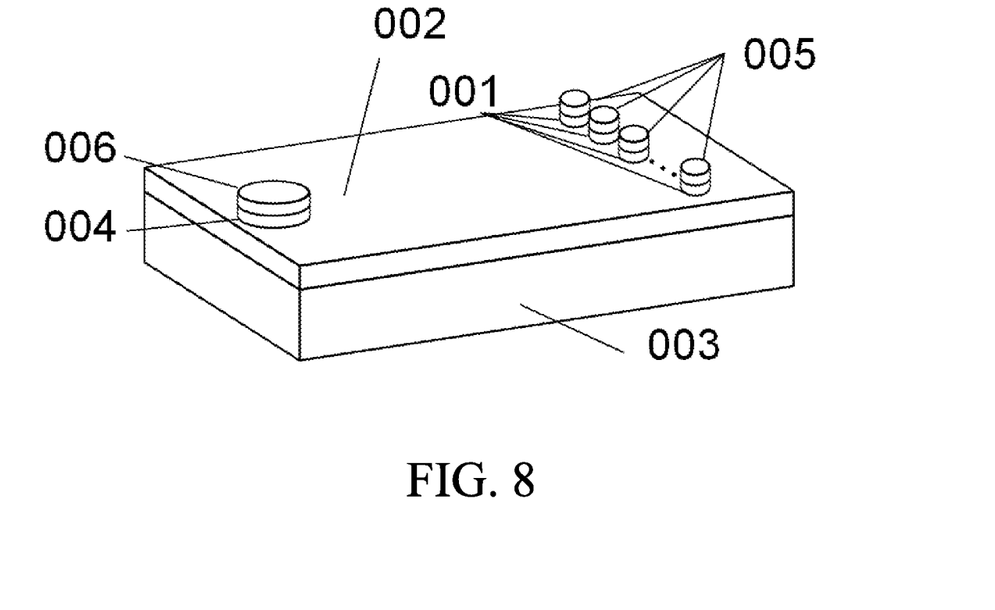
FIG. 8 is a structural sketch view of a temperature sensor according to the preferred embodiment of the present invention.

In some embodiments, the temperature sensors can be spintronics temperature sensors based on the ferrimagnetic skyrmions. As shown in FIG. 8, the ferrimagnetic skyrmion sensor comprises: a thin ferrimagnetic layer film 002, comprising a limited area, wherein the ferrimagnetic skyrmions are formed in the limited area; a current transmission layer 003, for transmitting the spin-polarized current to the limited area of the thin ferrimagnetic layer film 002; a plurality of first insulation pillars 001, which are arranged on the surface of the thin ferrimagnetic layer film 002 and far away from the current transmission layer 003, and located at set positions of the limited area; and a plurality of first magnetic layers 005, which respectively correspond to the first insulation pillars 001 and are arranged on the surface of each first insulation pillar 001 and far away from the thin ferrimagnetic layer film 002; wherein: each first insulation pillar 001 has a first thickness able to make up a first MTJ together with the thin ferrimagnetic layer film 002 and the corresponding first magnetic layer 005; the external current detecting component applies a given voltage to each first magnetic layer 005 and collects the current under the given voltage, so as to monitor the temperature value according to the varied current flowing through each first magnetic layer 005 with a set position of a corresponding first insulation pillar 001; the temperature sensor further comprises a second insulation pillar 004, which is arranged on the surface of the thin ferrimagnetic layer film 002 and far away from the current transmission layer 003, and located at an arbitrary position of the limited area; the temperature sensor further comprises a second magnetic layer 006, which is arranged on the surface of the second insulation pillar 004 and far away from the thin ferrimagnetic layer film 002; and the second insulation pillar 004 has a second thickness able to make up a second MTJ together with the thin ferrimagnetic layer film 002 and the second magnetic layer 006.

In the above embodiment, the principle of the ferrimagnetic skyrmion temperature sensor is described as follows. When the current is applied to the current transmission layer 003, the spin orbital torque current will drive the formed skyrmions to move from one side to the other side in the limited area. Because of the different ambient temperatures, the ferrimagnetic skyrmions will obtain the different hall angles in the movement, so that different positions are reached when moving to the other side of the limited area. After reaching the set positions, the ferrimagnetic skyrmions become stationary; at this time, the ferrimagnetic skyrmions will change the magnetic torque directions of two terminals of the first MTJs on the set positions; because the magnetic torque direction on each first magnetic layer 005 is constant, after changing the magnetic torque direction of the other terminal of each first MTJ, the resistance state of the first MTJ is changed, so that the current outputted under the same voltage is changed.

According to the preferred embodiment of the present invention, it is not required to know the detailed value of the current; it is only required to know whether the outputted current signal is a varied current signal; for example, a comparator can be used for judging; when the outputted current signal is consistent with the reference current, the comparator outputs "0", indicating there is no change; when the outputted current signal is inconsistent with the reference current, the comparator outputs "1", indicating that the current is a varied current. Certainly, the current change can be determined through other realizable methods or technologies, and the present invention is not limited thereto. It can be known that the highly reliable STT-MRAM structure in the preferred embodiment of the present invention has advantages as follows:

(1) the temperature sensor components are in situ on-chip integrated, and the different memory blocks are monitored independently;

(2) through the modulation to the voltage/frequency of the reading and writing operations, the instantaneous temperatures of the different memory blocks of the STT-MRAM structure are self-adaptively adjusted;

(3) the reliability of the STT-MRAM structure is improved;

(4) the wider working temperature range is obtained; and (5) the lifetime of the STT-MRAM structure is lengthened.

Figure 7:
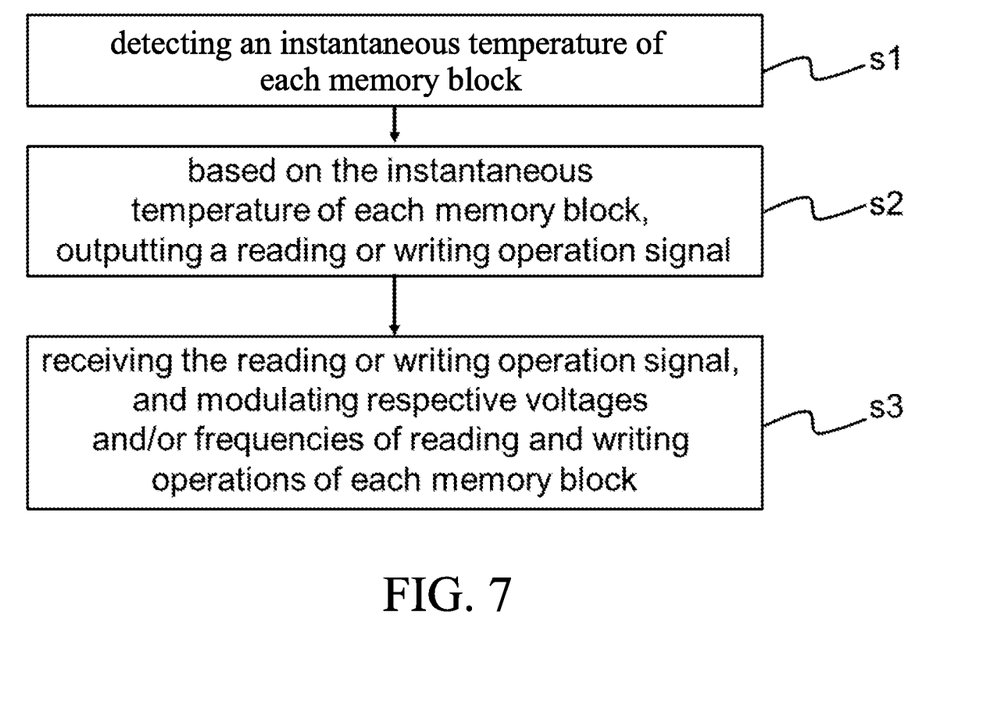
FIG. 7 is a flow diagram of an implementation method of the highly reliable STT-MRAM structure according to the preferred embodiment of the present invention.

Furthermore, the present invention further provides an implementation method of the above highly reliable STT-MRAM structure, as shown in FIG. 7, comprising steps of:

(S1) detecting the instantaneous temperature of each memory block;

(S2) based on the instantaneous temperature of each memory block, outputting a reading or writing operation signal; and (S3) receiving the reading or writing operation signal, and modulating respective voltages and/or frequencies of reading and writing operations of each memory block.

Based on the same inventive concept, the implementation method of the highly reliable STT-MRAM structure is provided; the instantaneous temperature of each memory block is detected through each in-sit temperature sensor and then the temperature signal is transmitted to the controller; thereafter, based on the received temperature signal of each memory block, the controller outputs the reading or writing operation signal, so as to modulate the voltages and/or frequencies of the reading and writing operations; when the instantaneous temperature is too high, the voltages and/or frequencies of the reading and writing operations would be decreased, to the contrary when the instantaneous temperature is too low, the voltages and/or frequencies of the reading and writing operations would be increased, so as to maintain a suitable working temperature of the memory block array, and further to solve the problems of the write failure in the low-temperature zone and the read error in the high-temperature zone of the STT-MRAM structure, which expands a reliable working range of the STT-MRAM structure and lengthens the lifetime of the STT-MRAM structure.

Furthermore, the present invention can also monitor the whole temperature of the memory block array, namely give a comprehensive operation signal with combining the temperatures of all the memory blocks.

The present invention further provides a second highly reliable STT-MRAM structure, comprising:

a memory block array, comprising a plurality of memory blocks;

temperature sensors, for detecting instantaneous temperatures of at least part of the memory blocks in the memory block array; and a controller, which generates an average temperature according to temperature values monitored by the temperature sensors and outputs a reading or writing operation signal based on the average temperature, so as to modulate voltages and/or frequencies of reading and writing operations of the memory block array.

The second highly reliable STT-MRAM structure is different from the first highly reliable STT-MRAM structure in that: the controller outputs an overall reading or writing operation signal based on the average value of the temperatures collected at the temperature sampling points; the reading or writing operation signal modulates the voltages and/or frequencies of the reading and writing operations of the whole memory block array.

Based on the same inventive concept, the second highly reliable STT-MRAM structure is provided; the temperature of the whole memory block array is detected and then the temperature signal is transmitted to the controller; based on the received temperature signal, the controller outputs the reading or writing operation signal, so as to modulate the voltages and/or frequencies of the reading and writing operations; when the temperature is too high, the voltages and/or frequencies of the reading and writing operations would be decreased, to the contrary when the temperature is too low, the voltages and/or frequencies of the reading and writing operations would be increased, so as to maintain a suitable working temperature of the memory block array, and further to solve the problems of the write failure in the low-temperature zone and the read error in the high-temperature zone of the STT-MRAM structure, which expands a reliable working range of the STT-MRAM structure and lengthens the lifetime of the STT-MRAM structure.

The embodiments of the present invention are all described in a progressive way, the same and similar parts among the embodiments can be referenced from each other, and each embodiment focuses on the differences from the other embodiments. The terms such as "include" and "comprise" and any other variants mean the non-exclusive inclusion, so that the process, method, object or device including a series of elements not only includes the illustrated elements, but also includes other elements which are not specifically listed or the inherent elements of the process, method, object or device. At a condition without more limitations, the term "comprising . . ." includes the limited elements and does not exclude other elements from the process, method, object or device including the limited elements. Moreover, the showed or discussed mutual coupling, direct coupling or communication connection can be realized through some interfaces; the indirect coupling or communication connection between the devices or units can be realized electrically, mechanically or in other forms. The embodiments of the present invention are all described in the progressive way, the same and similar parts among the embodiments can be referenced from each other, and each embodiment focuses on the differences from the other embodiments. Particularly, for the system embodiment, because it is basically similar to the method embodiment, it is described simply, and the related content can refer to the illustration in the method embodiment. In the description of the present invention, reference terms such as "one embodiment", "some embodiments", "an example", "detailed example", or "some examples" mean that a detailed feature, structure, material, or characteristic of the described embodiments or examples are included in at least one embodiment or example of the present invention. In the specification, the schematic representation of the above terms is not aimed at the same embodiment or example. Furthermore, one skilled in the art is able to combine the described different embodiments or examples and the features thereof if not conflicting to each other. The above-described is merely the preferred embodiment of the present invention, not for limiting the present invention. For one skilled in the art, various modifications and changes can be made based on the preferred embodiment of the present invention. All of the modifications, equivalent replacements and improvements made within the spirit and principles of the preferred embodiment of the present invention should be encompassed in the protection range of the claims of the present invention.

What is claimed is:

1. A highly reliable STT-MRAM (Spin transfer torque-magnetic random access memory) structure, comprising:
    a memory block array, comprising a plurality of memory blocks;
    temperature sensors, for detecting instantaneous temperatures of each of the memory blocks in the memory block array; and
    a controller, which outputs a reading or writing operation signal based on the instantaneous temperature of each memory block detected by the temperature sensors, so as to modulate respective voltages and/or frequencies of reading and writing operations of each memory block;
    wherein each temperature sensor comprises:
    a thin ferrimagnetic layer film, comprising a limited area, wherein ferrimagnetic skyrmions are formed in the limited area;
    a current transmission layer, for transmitting a spin-polarized current to the limited area of the thin ferrimagnetic layer film;
    a plurality of first insulation pillars, which are arranged on a surface of the thin ferrimagnetic layer film and far away from the current transmission layer, and located at set positions of the limited area; and
    a plurality of first magnetic layers, which respectively correspond to the first insulation pillars and are arranged on a surface of each first insulation pillar and far away from the thin ferrimagnetic layer film;
    each first insulation pillar has a first thickness able to make up a first MTJ (Magnetic tunnel junction) together with the thin ferrimagnetic layer film and a corresponding first magnetic layer;
    an external current detecting component applies a given voltage to each first magnetic layer and collects a current under the given voltage, so as to monitor a temperature value according to a varied current flowing through each first magnetic layer with a set position of a corresponding first insulation pillar;
    each temperature sensor further comprises a second insulation pillar, which is arranged on the surface of the thin ferrimagnetic layer film and far away from the current transmission layer, and located at an arbitrary position of the limited area;
    each temperature sensor further comprises a second magnetic layer, which is arranged on a surface of the second insulation pillar and far away from the thin ferrimagnetic layer film; and
    the second insulation pillar has a second thickness able to make up a second MTJ together with the thin ferrimagnetic layer film and the second magnetic layer.

2. The highly reliable STT-MRAM structure, as recited in claim 1, wherein: the controller comprises a plurality of external voltage drives, which could change reading and/or writing operation voltages of each memory block according to the instantaneous temperature detected by the temperature sensors.

3. The highly reliable STT-MRAM structure, as recited in claim 2, wherein: based on a preset first relationship, according to the instantaneous temperature of each memory block, the controller modulates the writing operation voltage $V_{dd\_w}$; the preset first relationship is an inverse proportional function of temperature T, and a formula thereof is:

$V_{dd\_w}=V_{w0}-k_1T$, wherein: $k_1$ is a positive coefficient, and $V_{w0}$ is a constant based on a magnetization switching voltage at zero absolute temperature.

4. The highly reliable STT-MRAM structure, as recited in claim 2, wherein: based on a preset second relationship, according to the instantaneous temperature of each memory block, the controller modulates the reading operation voltage $V_{dd\_r}$; the preset second relationship is a proportional function of temperature T, and a formula thereof is:

$V_{dd\_r}=V_{r0}+k_2T$, wherein: $k_2$ is a positive coefficient, and $V_{r0}$ is a constant based on the reading operation voltage at zero absolute temperature.

5. The highly reliable STT-MRAM structure, as recited in claim 1, wherein: the controller comprises a plurality of external frequency drives, which could change reading and/or writing operation frequencies of each memory block according to the instantaneous temperature detected by the temperature sensors.

6. The highly reliable STT-MRAM structure, as recited in claim 5, wherein: based on a preset third relationship, according to the instantaneous temperature of each memory block, the controller modulates the writing operation frequency $f_{write}$; the preset third relationship is a proportional function of temperature T, and a formula thereof is:

$f_{write}=f_0+k_3T$, wherein: $k_3$ is a positive coefficient, and $f_0$ is a constant based on the writing operation frequency at zero absolute temperature.

7. The highly reliable STT-MRAM structure, as recited in claim 1, wherein each memory block comprises at least one MTJ.

8. An implementation method of the highly reliable STT-MRAM structure as recited in claim 1, comprising steps of:
   detecting an instantaneous temperature of each memory block;
   based on the instantaneous temperature of each memory block, outputting a reading or writing operation signal; and
   receiving the reading or writing operation signal, and modulating respective voltages and/or frequencies of reading and writing operations of each memory block.

9. A highly reliable STT-MRAM structure, comprising:
   a memory block array, comprising a plurality of memory blocks;
   temperature sensors, for detecting instantaneous temperatures of at least part of the memory blocks in the memory block array; and
   a controller, which generates an average temperature according to temperature values monitored by the temperature sensors and outputs a reading or writing operation signal based on the average temperature, so as to modulate voltages and/or frequencies of reading and writing operations of the memory block array;
   wherein each temperature sensor comprises:
   a thin ferrimagnetic layer film, comprising a limited area, wherein ferrimagnetic skyrmions are formed in the limited area;
   a current transmission layer, for transmitting a spin-polarized current to the limited area of the thin ferrimagnetic layer film;
   a plurality of first insulation pillars, which are arranged on a surface of the thin ferrimagnetic layer film and far away from the current transmission layer, and located at set positions of the limited area; and
   a plurality of first magnetic layers, which respectively correspond to the first insulation pillars and are arranged on a surface of each first insulation pillar and far away from the thin ferrimagnetic layer film;
   each first insulation pillar has a first thickness able to make up a first MTJ (Magnetic tunnel junction) together with the thin ferrimagnetic layer film and a corresponding first magnetic layer;
   an external current detecting component applies a given voltage to each first magnetic layer and collects a current under the given voltage, so as to monitor a temperature value according to a varied current flowing through each first magnetic layer with a set position of a corresponding first insulation pillar;
   each temperature sensor further comprises a second insulation pillar, which is arranged on the surface of the thin ferrimagnetic layer film and far away from the current transmission layer, and located at an arbitrary position of the limited area;
   each temperature sensor further comprises a second magnetic layer, which is arranged on a surface of the second insulation pillar and far away from the thin ferrimagnetic layer film; and
   the second insulation pillar has a second thickness able to make up a second MTJ together with the thin ferrimagnetic layer film and the second magnetic layer.

\* \* \* \* \*